US 6,586,918 B2

(12) United States Patent
Gee

(10) Patent No.: US 6,586,918 B2
(45) Date of Patent: Jul. 1, 2003

(54) CURRENT GENERATOR CIRCUIT AND METHOD OF PROVIDING DRIVE CURRENT TO A LASER DIODE DRIVER

(75) Inventor: David Martin Gee, Manningtree (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/041,470

(22) Filed: Jan. 10, 2002

(65) Prior Publication Data
US 2002/0171406 A1 Nov. 21, 2002

(30) Foreign Application Priority Data
Apr. 30, 2001 (EP) .............................. 01303927

(51) Int. Cl.⁷ ............................................ G05F 1/56
(52) U.S. Cl. ...................................................... 323/315
(58) Field of Search ................................ 323/312, 313, 323/315

(56) References Cited
U.S. PATENT DOCUMENTS

| 4,334,198 A | * | 6/1982 | Malchow | 330/296 |
| 4,779,061 A | | 10/1988 | Matthies | |
| 5,572,166 A | * | 11/1996 | Gilbert | 330/254 |
| 5,731,696 A | * | 3/1998 | Pennisi et al. | 323/313 |
| 5,977,759 A | * | 11/1999 | Sitch | 323/315 |
| 6,211,658 B1 | * | 4/2001 | Ganser et al. | 323/313 |

FOREIGN PATENT DOCUMENTS

| EP | 0 103 768 | 3/1984 |
| GB | 2335556 A | 9/1999 |

OTHER PUBLICATIONS

English–language Patent Abstract of JP 62 145907. Jun. 3, 1987.
English–language Patent Abstract of JP 63 285006. Nov. 22, 1988.
English–language Patent Abstract of JP 2000 124862. Apr. 22, 2000.
English–language patent Abstract of JP 61 242415. Oct. 28, 1986.

* cited by examiner

Primary Examiner—Adolf Denske Berhane

(57) ABSTRACT

To provide a stabilized current to a current modulator or the like in a limited voltage headroom environment, the a current mirror having first and second mirror transistors is provided. Bases of the transistors are coupled together through a resistive element, with base leakage current to the first transistor generating a voltage drop across the resistive element. The voltage drop acts to boost a voltage through an emitter resistor of an output stage of the current mirror, the output stage realized by at least the second mirror transistor. With boosting of the voltage through the emitter resistor there is a corresponding boost in output current defined by the voltage across emitter resistor. As such, the circuit effectively increases the operating voltage and hence the voltage headroom derived from a supply voltage provided to the bases of the first and second mirror transistors.

10 Claims, 4 Drawing Sheets

US 6,586,918 B2

CURRENT GENERATOR CIRCUIT AND METHOD OF PROVIDING DRIVE CURRENT TO A LASER DIODE DRIVER

FIELD OF THE INVENTION

This invention relates, in general, to current generator stabilisation circuits and is particularly, but not exclusively, applicable to laser driver circuits operating in voltage environments having restricted voltage headroom.

BACKGROUND ART

In the control of laser diodes devices and the like, it is imperative that accurate current control be exercised. Indeed, to establish accurate laser operation, it is necessary to ensure that currents are stable and unaffected by integrated circuit (IC) process parameters. More specifically, it will be appreciated that the "extinction ratio" of the lasing device must be kept constant. As will be understood, the extinction ratio is the current ratio between a first current yielding a light level attributed to a logical zero value and a second current yielding a light level attributed to a logical one value. Moreover, it is an ac modulation current to the laser diode that provides a logic level control mechanism through which transitions between logical states are controlled, the ac modulation current defined between the first current and the second current. Typical extinction ratios are between about 10:1 or 20:1.

For completeness, it will be appreciated that lasing operation will not commence before a minimum current threshold ($I_{thres}$) has been surpassed and that logical zero is defined by a current greater than $I_{thres}$. Furthermore, laser diode operation (having regard to the ac modulation current range) varies as a function of temperature.

Commercial laser diode systems operate in the giga Hertz range (GHz) and employ bi-polar transistor technology to allow use of base current leakage. In a move to control power dissipation, however, operating platforms are moving towards lowering supply voltages initially from five volts (5 V) to 3.3 V and below. With the supply providing current to be drawn by the laser diode, a conventional current mirror circuit compensates for current error due to base current by employing an emitter-follower structure; this stabilises laser current supply. Current error is particularly prevalent in circuits having high mirror ratio, say 12:1, current mirrors where the current base ($I_{base}$) problem is exacerbated.

UK Patent application 2 335 556 describes an emitter-follower arrangement in a BiMOS switched current source for a digital to analog converter (DAC) or phase lock loop (PLL) charge pump.

Unfortunately, to date, transistor current mirror compensation techniques (employing multiple transistors) require voltage headroom that may exceed the inherent capabilities of the supply voltage $V_{cc}$, with this particularly true in the context of silicon-germanium (SiGe) transistors where there is a trend to increased base-emitter junctions voltages, $V_{be}$. While the current base problem is most noticeable in pnp structures, npn structures are nevertheless susceptible.

SUMMARY OF THE INVENTION

According to a preferred embodiment of the present invention there is provided a current mirror circuit of a laser driver circuit, the current mirror circuit comprising: first and second mirror transistors each having a base electrode and an emitter electrode; first and second emitter resistors coupled, respectively, to the emitter electrodes of the first and second mirror transistors, and characterised by: a resistive element coupled between said base electrodes such that, in use, base leakage current to the first transistor from a current supply causes a voltage drop across the resistive element, wherein the voltage drop acts to boost a voltage through the emitter resistor of the second mirror transistor, thereby to boost, in use, output current provided by the second mirror transistor to the laser driver circuit.

In a second aspect of the present invention there is provided a method of providing drive current in a laser diode circuit, the method comprising: providing an input current to an input stage of a current mirror, the input current provided to a collector electrode of a first transistor; and characterised by: coupling together base electrodes of the first transistor and a second transistor of an output stage of the current mirror, the coupling occurring through a resistive element arranged to cause generation of a voltage drop across the resistive element; and modulating an output current from the output stage of the current mirror, the output current boosted by the voltage drop across the resistive element to provide the drive current.

The output current provides current to a current modulator arranged to control an extinction ratio associated with operation of a laser diode.

In a further aspect of the present invention there is provided a resistive beta compensation current mirror arranged to boost output current supplied to a laser diode having an operational power supply that is less than about 5 volts.

Another aspect of the present invention provides use of a resistive beta compensation current mirror to boost output current supplied to a laser diode having an operational power supply that is less than about 5 volts, the laser diode preferably supported by a silicon-germanium bipolar transistor semiconductor technology.

In still yet another aspect of the present invention there is provided a current mirror circuit connectable, in use, to a laser driver circuit, the current mirror circuit comprising: first and second mirror transistors each having a base electrode and an emitter electrode; first and second emitter resistors coupled, respectively, to the emitter electrodes of the first and second mirror transistors, and characterised by: a resistive element coupled between said base electrodes such that, in use, base leakage current to the first transistor from a current supply causes a voltage drop across the resistive element, wherein the voltage drop acts to boost a voltage through the emitter resistor of the second mirror transistor, thereby to boost, in use, output current provided by the second mirror transistor to the laser diode circuit.

The present invention applies resistive beta compensation mirrors to control accurately, for example, laser diodes operating from relatively low supply voltages. Advantageously, the present invention therefore provides an improvement in stabilisation of a current generator output employing a current mirror in a low supply voltage environment, especially in a laser driver circuit environment.

BRIEF DESCRIPTION OF THE DRAWINGS

Exemplary embodiments of the present invention will now be described with reference to the accompanying drawings, in which.

DETAILED DESCRIPTION OF THE INVENTION

Figure 1:
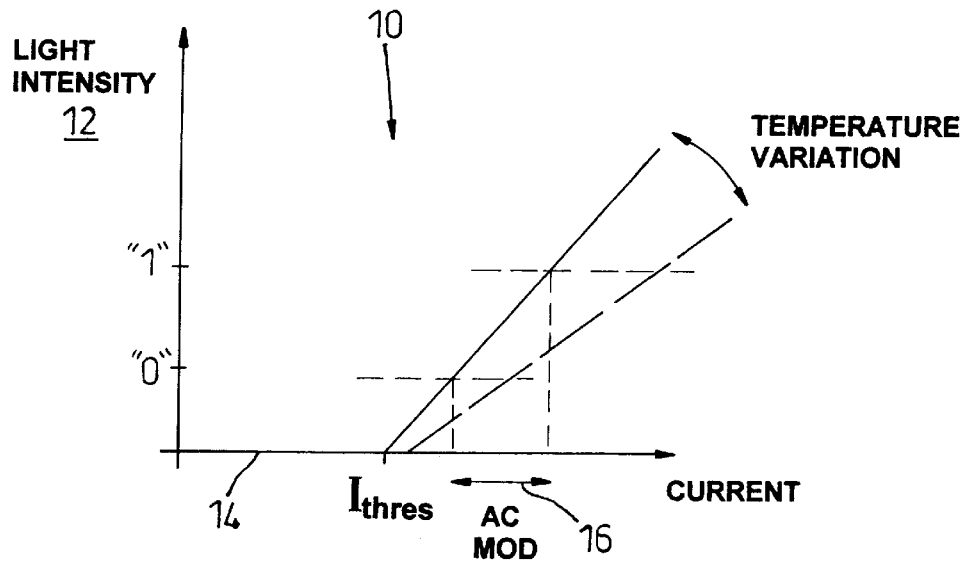
FIG. 1 is a graph illustrating light intensity as a function of current drawn by a laser diode, the graph showing logical light intensities defining the extinction ratio.
Figure 2:
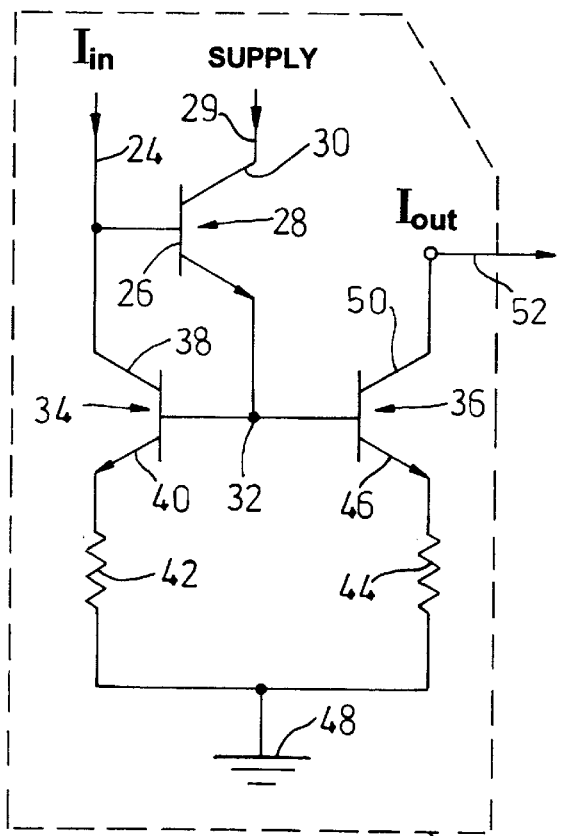
FIG. 2 is a circuit diagram of a conventional current control circuit in a bipolar npn transistor architecture.
Figure 3:
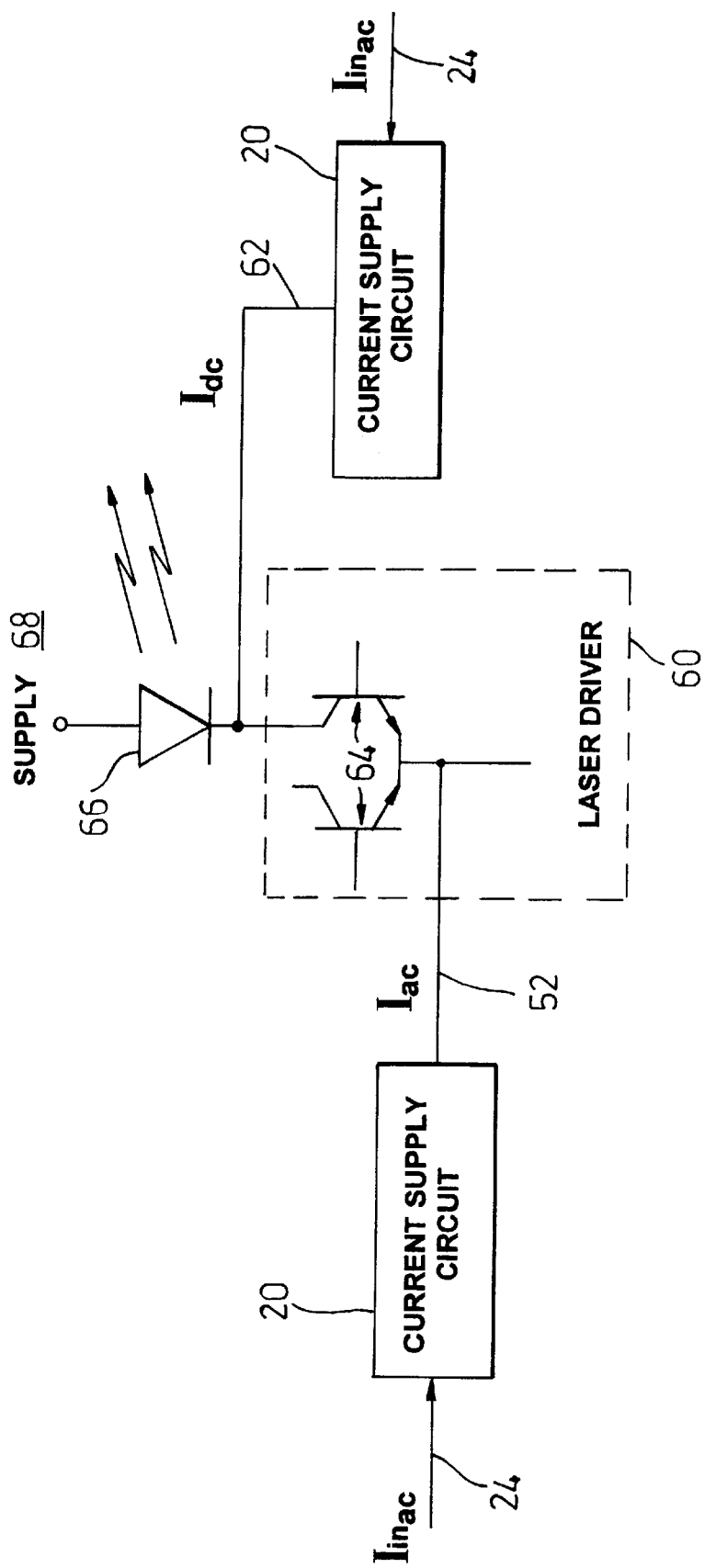
FIG. 3 is a conventional laser driver circuit supported by current control circuits of FIG. 2.

Before discussing the present invention in detail, reference is first made to FIGS. 1 and 2 that place the requirements for accurate control of the extinction ratio (FIG. 1) in the context of a laser diode driver circuit (FIG. 3) having an associated current generator circuit (FIG. 2).

The construction of the graph 10 illustrating light intensity 12 as a function of current 14 drawn by a laser diode has been described above and no further explanation is therefore required save to say that ac modulating current 16 is essentially provided by a current generator circuit 20.

With respect to the current generator circuit 20 in a typical prior art implementation (described in the context of an npn implementation), a current supply $I_{in}$ 24 provides current base electrode 26 of emitter-follower transistor 28. The current generator circuit 20, in the context of a laser diode driver circuit, therefore acts as a current source. (These current sources may be modulated or may be controlled via analogue or digital control loops).

A collector electrode 30 of the emitter-follower transistor 28 (in the current generator circuit 20) is coupled to receive voltage supply $V_{cc}$ 29, whilst the emitter electrode is coupled to a common circuit node 32 between base electrodes of first 34 and second 36 mirror transistors. A collector electrode 38 of first mirror transistor 34 is also coupled to the base electrode 26 of emitter-follower transistor 28. An emitter electrode 40 of the first 34 mirror transistor is coupled to a first resistor 42 that is in parallel with a second resistor 44 further coupled to an emitter 46 of the second 36 mirror transistor. Terminals of the first resistor 42 and the second resistor 44 remote to the first 34 and second 36 mirror transistors are coupled to a reference plane 48, typically ground potential. The collector electrode 50 of second mirror transistor 36 provides output current $I_{out}$ 52 to a laser diode driver circuit 60 of FIG. 3.

The laser diode circuit 60 is a schematic representation showing only the principal components. The laser diode driver circuit 60 is coupled to receive output current Iout 52 from the collector electrode 50 of second mirror transistor 36 (of FIG. 2). More specifically, in a conventional implementation, ac and dc drive current (corresponding to current output Iout 52) is respectively supplied by a pair of current generator circuits 20, each current generator circuit 20 potentially set up in a different way through selection of differing component values. In operation, ac modulation current $I_{ac}$ feeds a mirrored-pair of transistors 64, one of which is coupled to a laser diode 66 typically implemented externally to the laser driver as a discrete transistor outline (TO) package. The dc current source 62 is coupled to a point between the mirrored-pair of transistors 64 and the laser diode 66, as will be understood. The laser diode 66, the laser driver 60 and current sources are coupled between a supply potential 68 and a reference plane (not shown), e.g. ground potential.

Figure 4:
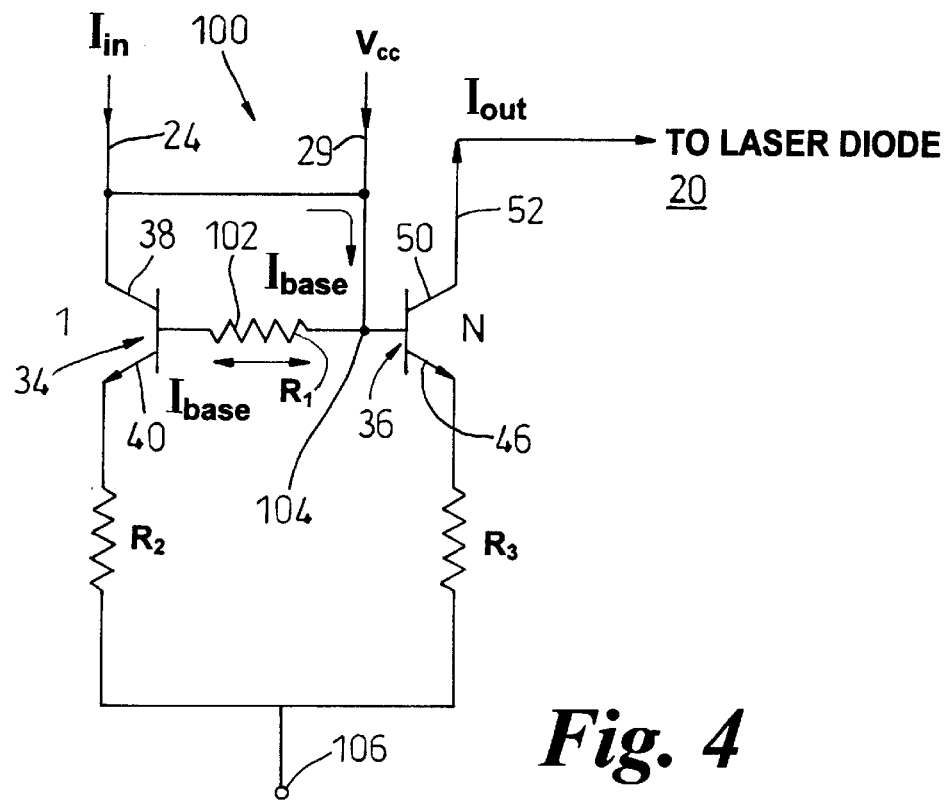
FIG. 4 is a diagram of a current generator circuit according to a preferred embodiment of the present invention.

Turning now to FIG. 4, which is a diagram of a current generator circuit 100 according to a preferred embodiment of the present invention. In contrast with the current generator circuit 20 of FIG. 2, the emitter-follower transistor 28 (in the current mirror) is omitted in favour of a mirror base resistor ($R_1$) 102 coupled between base electrodes of the first and second mirror transistors. The current supply $I_{in}$ 24 is provided to the collector electrode 38 of first mirror transistor 34 and a circuit node 104 between the base of second mirror transistor 36 and mirror base resistor ($R_1$) 102. Emitter degradation resistors $R_2$ and $R_3$ (that correspond to first and second resistors 42 and 44 of FIG. 2) act to stabilise voltage effects. Although the mirror base resistor ($R_1$) 102 is shown in single component form, it will be understood that the mirror base resistor 102 can be realised by a combination of serial and parallel resistances between the current supply $I_{in}$ 24 and the base of the second mirror transistor 36. Voltage supply $V_{cc}$ 29 is provided to circuit node 104. The emitter degradation resistors $R_2$ and $R_3$ are further coupled to a suitable reference plane 106, which may be ground potential.

In the context of the current mirror (having a gain of 1:N) realised by the first and second mirror transistors 34 and 36, generation of a voltage $V=I_{base}R_1$ between the base electrodes has the effect of boosting the voltage through resistor $R_3$ and, consequently, to boost output current $I_{out}$ 52 (defined by the voltage across $R_3$). Expressed mathematically, the base current or leakage current $I_{base}$ is:

$$I_{base}=I_{be(34)}=I_{in}-I_{ce(34)}-I_{be(36)}$$

where $=I_{in}$ is the input current; $I_{ce(34)}$ is the collector-emitter current through transistor 34; and $I_{be(36)}$ is the base-emitter current through transistor 36. It will be appreciated, therefore, that transistor 36 clearly also draws base current.

As such, the circuit of the preferred embodiment effectively increases the operating voltage and hence the voltage headroom derived from the supply voltage $V_{cc}$.

Provided that the transistor gains (interchangeably known as $h_{fe}$ or β) are relatively high and also the voltage across $R_3$ is very much greater than $V_T$=kT/q, where k is the Boltzmann's constant voltage across resistor $R_3$, q is charge and T is the absolute temperature (e.g. $V_T$ twenty-six millivolts (26 mV) at two hundred and ninety-three Kelvin (293 K)), the voltage drop $I_{base}R_1$ is large and the relative resistances can be expressed as:

$$R_3 = \frac{1}{N}R_2 \qquad \text{Eqn. 1}$$

and $$R_1=(N+1)R_2 \qquad \text{Eqn. 2}$$

where N is the gain (e.g. 4, 8, 12, . . . ) in the current mirror. It should be noted that the above equations are independent of valued input current $I_{in}$ or temperature, and only hold true in the case where the voltage across $R_3$ is much greater than kT/q.

In the case where the voltage ($V_{R3}$) across resistor $R_3$ is not much greater or substantially equal to kT/q, Eqn. 1 and Eqn. 2 can be further refined to optimise the value of $R_1$ for a given output current $I_{out}$ at a stated temperature:

$$\frac{R_1}{R_2} = (N+1)\left(1 + \frac{NV_T}{R_2 I_{out}}\right) \quad \text{Eqn. 3}$$

In other words, using Eqn. 3, it is possible to set the extinction ratio very accurately for low supply voltages Eqn. 3 is therefore used to correct for low gain at a low and substantially fixed $I_{base}R_1$ voltage drop at a substantially fixed temperature and with a substantially fixed voltage supply.

Figure 5:
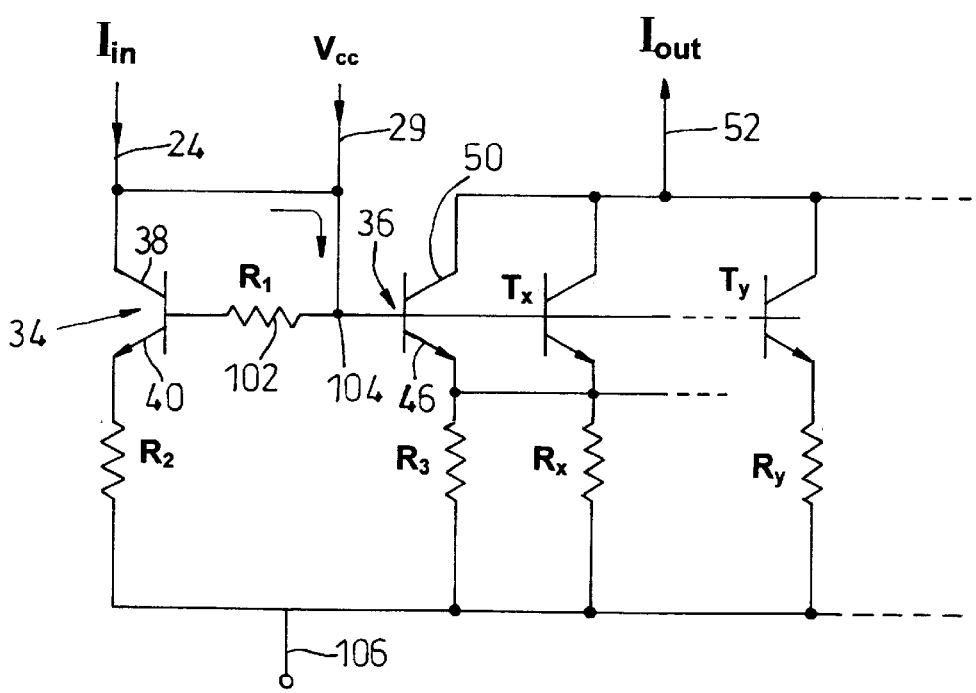
FIG. 5 is an alternative embodiment of a current generator circuit of the present invention.

As a further design feature, it is acknowledged that it may be desirable to cascade transistor mirror circuits a plurality of times to increase gain; this is shown in FIG. 5. In essence, FIG. 5 is identical to FIG. 4, although an output side of the current mirror has successive electrically coupled current mirror (amplification) stages comprised from base-coupled transistors $T_x$, $T_y$ having emitter electrodes tied to the reference plane 106 through parallel emitter resistors $R_3$, $R_x$, $R_y$. Collector electrodes of base-coupled transistors $T_x$, $T_y$ are summed to provide the output current $I_{out}$ 52. Emitters from the base coupled transistors $T_x$, $T_y$ may be coupled together to facilitate ease in circuit topology. The values of $R_3$, $R_x$, $R_y$ may be dissimilar so as to change the respective gains of each stage.

Figure 6:
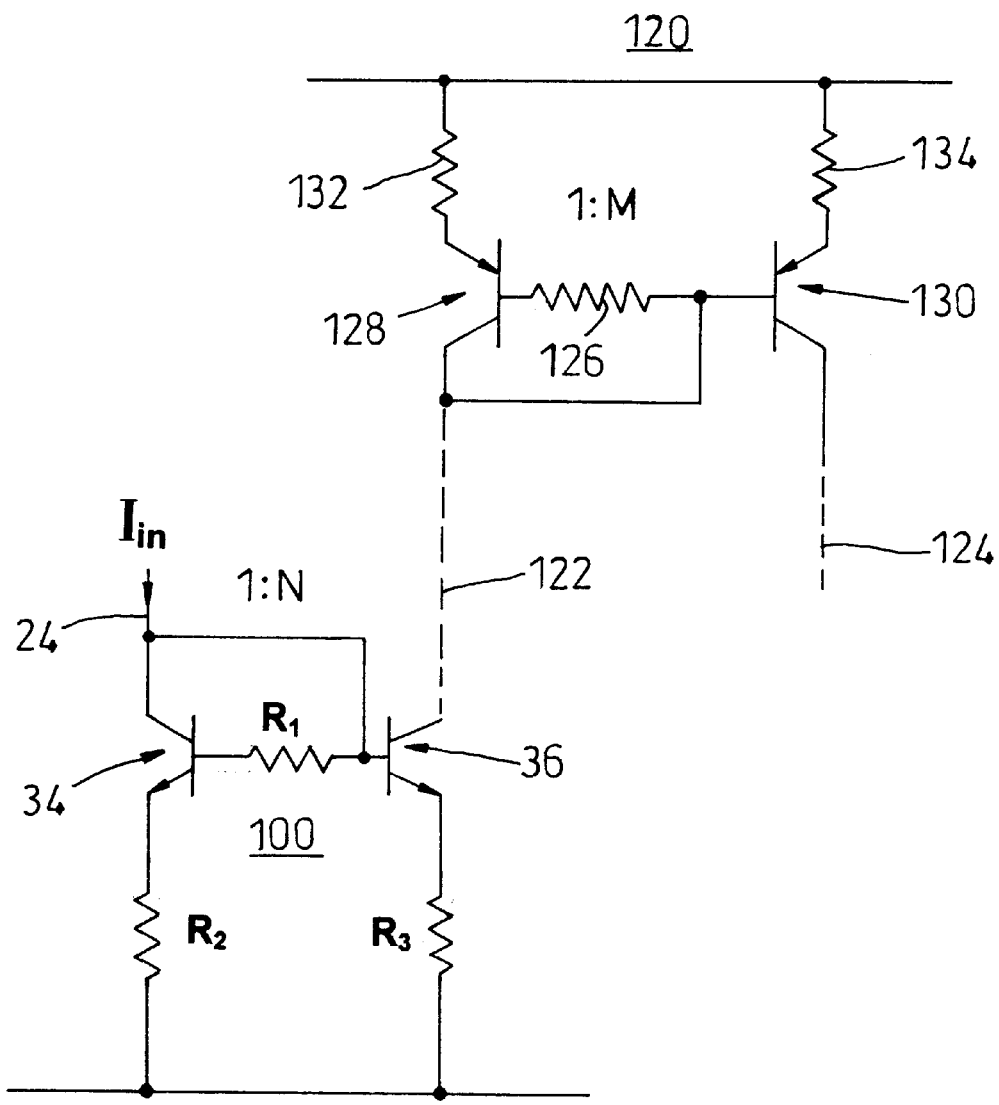
FIG. 6 is a further embodiment of the present invention showing serial cascading of npn and pnp current mirrors.

FIG. 6 is a further embodiment of the present invention showing serial cascading of npn and pnp current mirrors. Specifically, an npn-current mirror 100 of the preferred embodiment (as described in FIG. 4) has a gain 1:N. Serially cascading the collector electrode of second mirror transistor 36 to a complementary pnp-current mirror 120 having a gain of 1:M provides an overall current gain as the product MN. Serial cascading may occur through ancillary circuit components that will be readily appreciated by the skilled addressee, the serial components omitted for clarity but represented by the dashed lines 122 and 124. As regards the pnp-current mirror 120, a base resistor 126 couples together base electrodes of an input transistor 128 and an output transistor 130. The collector electrode of second mirror transistor 36 is coupled to both the collector of the input transistor 128 and the base of output transistor 130. Emitter electrodes of the pnp-current mirror 120 are coupled to a reference potential via resistive elements 132 and 134 having suitably selected component values.

It will, of course, be appreciated that the preferred embodiment has been given by way of example only and that modifications in detail may be made within the scope of the present invention. Although the output current is shown as utilised by both the ac modulator and dc modulator control circuits, it is clearly possible to isolate use of the current mirror circuit of the present invention to one or other of these control circuits, if desired.

What is claimed is:

1. A current mirror circuit of a laser driver circuit, the current mirror circuit comprising a current mirror, said current mirror comprising:

first and second mirror transistors each having a base electrode and an emitter electrode;

a resistive element $R_1$ coupled between said base electrodes; and a first emitter resistor $R_2$ and a second emitter resistor $R_3$ coupled, respectively, to the emitter electrodes of the first and second mirror transistors;

wherein the resistive element is coupled between said base electrodes such that, in use, base leakage current to the first transistor from a current supply causes a voltage drop across the resistive element, wherein the voltage drop acts to boost a voltage through the emitter resistor of the second mirror transistor, thereby to boost, in use, output current provided by the second mirror transistor to the laser driver circuit; and the emitter resistors $R_2$ and $R_3$ have resistances relationship of the form:

$$R_3 = \frac{1}{N} R_2$$

and one of:

$$R_1 = (N+1)R_2$$

and $$\frac{R_1}{R_2} = (N+1)\left(1 + \frac{NV_T}{R_2 I_{out}}\right)$$

where:

N is an overall gain of the current mirror; and $V_T = kT/q$, where k is Boltzmann's constant, q is charge and T is the absolute temperature.

2. The current mirror circuit of claim 1, further comprising at least one further current mirror output stage having a third transistor with a base electrode, an emitter electrode and an associated emitter resistor, said third transistor of the at least one further current mirror output stage having its base coupled to the base of the second transistor.

3. The current mirror circuit of claim 2, wherein the emitter electrodes of the second transistor and the third transistor are coupled together.

4. The current mirror circuit of claim 1, wherein said emitter resistors are coupled to a common reference plane.

5. The current mirror circuit of claim 1, the current mirror circuit containing a plurality of serially cascaded current mirrors.

6. An integrated circuit containing a plurality of current mirror circuits according to claim 1, the integrated circuit further including a laser driver circuit providing, in use, ac and dc drive currents, each of the current mirror circuits coupled to provide a current source to the laser driver circuit.

7. A method of providing drive current in a laser diode circuit, the method comprising the steps of:

providing an input current to an input stage of a current mirror, the input current provided to a collector electrode of a first transistor;

coupling together base electrodes of the first transistor and a second transistor of an output stage of the current mirror, the coupling occurring through a resistive element $R_1$ arranged to cause generation of a voltage drop across the resistive element; and modulating an output current from the output stage of the current mirror, the output current boosted by the voltage drop across the resistive element to provide the drive current;

wherein the method further comprises the step of coupling a first emitter resistor $R_2$ and a second emitter resistor $R_3$ to emitter electrodes of the first and second transistors, respectively, the emitter resistors $R_2$ and $R_3$ have resistances relationship of the form:

$$R_3 = \frac{1}{N}R_2$$

and one of:

$$R_1 = (N+1)R_2$$

and $$\frac{R_1}{R_2} = (N+1)\left(1 + \frac{NV_T}{R_2 I_{out}}\right)$$

where:

N is an overall gain of the current mirror; and $V_T = kT/q$, where k is Boltzmann's constant, q is charge and T is the absolute temperature.

8. The method of claim 7, wherein the output current provides current to a current source arranged to control an extinction ratio associated with operation of a laser diode.

9. A current mirror circuit connectable, in use, to a laser driver circuit, the current mirror circuit comprising a current mirror, said current mirror comprising:

first and second mirror transistors each having a base electrode and an emitter electrode;

a resistive element $R_1$ coupled between said base electrodes; and a first emitter resistor $R_2$ and a second emitter resistor $R_3$ coupled, respectively, to the emitter electrodes of the first and second mirror transistors;

wherein the resistive element is coupled between said base electrodes such that, in use, base leakage current to the first transistor from a current supply causes a voltage drop across the resistive element, wherein the voltage drop acts to boost a voltage through the emitter resistor of the second mirror transistor, thereby to boost, in use, output current provided by the second mirror transistor to the laser driver circuit; and the emitter resistors $R_2$ and $R_3$ have resistances relationship of the form:

$$R_3 = \frac{1}{N}R_2$$

and one of:

$$R_1 = (N+1)R_2$$

and $$\frac{R_1}{R_2} = (N+1)\left(1 + \frac{NV_T}{R_2 I_{out}}\right)$$

where:

N is an overall gain of the current mirror; and $V_T = kT/q$, where k is Boltzmarm's constant, q is charge and T is the absolute temperature.

10. An integrated circuit containing a plurality of current mirror circuits according to claim 9, the integrated circuit further including a laser driver circuit providing, in use, ac and dc drive currents, each of the current mirror circuits coupled to provide a current source to the laser driver circuit.

* * * * *